(12) United States Patent
Kemerer et al.

(10) Patent No.: US 8,756,554 B2
(45) Date of Patent: Jun. 17, 2014

(54) IDENTIFYING PARASITIC DIODE(S) IN AN INTEGRATED CIRCUIT PHYSICAL DESIGN

(75) Inventors: Douglas W. Kemerer, Essex Junction, VT (US); Edward W. Seibert, Williston, VT (US); Lijiang L. Wang, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/471,623

(22) Filed: May 15, 2012

(65) Prior Publication Data

US 2013/0067425 A1 Mar. 14, 2013

Related U.S. Application Data

(62) Division of application No. 12/337,061, filed on Dec. 17, 2008, now Pat. No. 8,191,030, which is a division of application No. 11/276,511, filed on Mar. 3, 2006, now Pat. No. 7,490,303.

(51) Int. Cl.
*G06F 17/50* (2006.01)

(52) U.S. Cl.
USPC ........... 716/133; 716/110; 716/111; 716/132; 716/136

(58) Field of Classification Search
USPC .................. 716/110–111, 132–133, 136
See application file for complete search history.

(56) References Cited

U.S. PATENT DOCUMENTS

| | | | |
|---|---|---|---|
| 5,313,079 A | 5/1994 | Brasen et al. | |
| 5,467,291 A * | 11/1995 | Fan et al. | 703/14 |
| 5,631,841 A | 5/1997 | Kishida et al. | |
| 5,638,286 A * | 6/1997 | Fujimoto | 716/115 |
| 6,161,212 A * | 12/2000 | Seely | 703/2 |
| 6,260,180 B1 | 7/2001 | McBride | |
| 6,732,340 B1 | 5/2004 | Akashi | |
| 6,772,404 B2 | 8/2004 | Tanaka | |
| 6,777,978 B2 * | 8/2004 | Hart et al. | 326/38 |
| 6,832,182 B1 | 12/2004 | Wilson, Jr. | |
| 6,842,045 B2 * | 1/2005 | Shimazaki et al. | 326/95 |
| 6,859,917 B2 * | 2/2005 | Shimazaki et al. | 716/103 |
| 6,931,607 B2 * | 8/2005 | Gunderson et al. | 716/108 |
| 6,941,531 B1 | 9/2005 | Teig et al. | |
| 7,103,522 B1 * | 9/2006 | Shepard | 703/14 |
| 7,117,454 B2 | 10/2006 | Baugh et al. | |
| 7,174,528 B1 * | 2/2007 | Burr et al. | 716/127 |
| 7,228,514 B2 | 6/2007 | Chan et al. | |
| 7,334,198 B2 | 2/2008 | Ditzel et al. | |
| 7,996,809 B2 * | 8/2011 | Ditzel et al. | 716/132 |
| 2002/0167042 A1 | 11/2002 | Angle et al. | |
| 2004/0025135 A1 * | 2/2004 | Hart et al. | 716/16 |
| 2004/0083435 A1 | 4/2004 | Gunderson et al. | |
| 2004/0128631 A1 | 7/2004 | Ditzel et al. | |
| 2004/0216074 A1 * | 10/2004 | Hart et al. | 716/16 |
| 2004/0268284 A1 | 12/2004 | Perez et al. | |

(Continued)

FOREIGN PATENT DOCUMENTS

JP 10312408 11/1998

*Primary Examiner* — Stacy Whitmore (74) *Attorney, Agent, or Firm* — Richard Kotulak; Roberts Mlotkowski Safran & Cole, P.C.

(57) ABSTRACT

A method comprises tracing a first and second terminal of a junction through a circuit layout to associated power supplies to determine their respective defined bias values. The method further comprises comparing the defined bias values of each terminal in order to determine, based on the comparison, whether the junction is forward biased.

19 Claims, 5 Drawing Sheets

(56) References Cited

U.S. PATENT DOCUMENTS

| | | |
|---|---|---|
| 2005/0091624 A1 | 4/2005 | Baugh et al. |
| 2006/0145086 A1 | 7/2006 | Liu et al. |
| 2006/0190900 A1 | 8/2006 | Chan et al. |
| 2007/0094628 A1* | 4/2007 | Dao ................................ 716/11 |
| 2008/0174334 A1* | 7/2008 | Chanda et al. ................ 324/765 |
| 2010/0229134 A1* | 9/2010 | Mizuno et al. .................... 716/5 |
| 2011/0258590 A1* | 10/2011 | Ditzel et al. .................. 716/133 |

\* cited by examiner

IDENTIFYING PARASITIC DIODE(S) IN AN INTEGRATED CIRCUIT PHYSICAL DESIGN

CROSS REFERENCE TO RELATED APPLICATIONS

The present application is a divisional of U.S. application Ser. No. 12/337,061, filed on Dec. 17, 2008, which is a divisional of U.S. application Ser. No. 11/276,511, filed Mar. 3, 2006 (now U.S. Pat. No. 7,490,303), the disclosures of which are expressly incorporated by reference herein in their entirety.

FIELD OF THE INVENTION

The invention relates to the design of integrated circuits, and more specifically, to the identification of parasitic diode(s) in the physical design of an integrated circuit.

BACKGROUND DESCRIPTION

The design of an integrated circuit (IC) that includes transistors and capacitors requires the implant and diffusion of donor or acceptor atoms within oppositely doped regions such as a substrate, nWell, or pWell. While the intent of the design is to create a functional device, these diffusions also form parasitic diodes to the surrounding substrate or Well regions. In early CMOS IC designs, it was always expected that the p-type substrate or pWell regions of the IC would be biased to the lowest potential available on the IC, and that n-type substrate or nWell regions would be biased toward the highest potential on the IC. Under this assumption, any p+ diffusion with an n-type background (or n+ diffusion in a p-type background) parasitic diode would be reverse biased and would not impact circuit function beyond the addition of a depletion capacitance.

Increasingly, however, as new IC designs push to higher performance, and analog functions are incorporated into ICs, biasing of Well structures between the highest and lowest potentials available has become commonplace. In addition, modern process technologies allow the existence of both nWell and pWell along with substrate on a single IC. And, it has become common for ICs to contain many voltage domains on a single die with data communication between voltage domains. As a result of this increased IC complexity and processing capacity, the risk of unintentionally creating a forward biased parasitic diode between supply domains of an IC during physical design has greatly increased.

Traditional Design Rule Check (DRC) tools verify that a layout can be manufactured as designed. Traditional Layout vs. Schematic (LVS) tools extract the layout and compare it to the schematic, to ensure a one-to-one correlation. Although DRC and LVS tools may be used independently, they are commonly used in conjunction with each other. Typically, these tools are used iteratively, and the masks are not built until the requirements of both tools are satisfied. While these methods are good at checking the design for adherence to technology ground rules and the equivalence of an IC physical design to its schematics, the detection and analysis of parasitic diode structures that can cause functional problems has not been successfully addressed. Designers have been left to verify their designs using a combination of parasitic netlist extraction and circuit simulation to ascertain whether the circuits function properly over a wide range of static and dynamic power scenarios.

Current methods and devices require exacting and exhaustive input patterns, and a careful review of the results, both of which are performed manually and are thus subject to human error. As these methods are heavily dependent upon the completeness of the simulation pattern suite, an incomplete or inaccurate extraction process may omit or alter the function of parasitic devices within the design.

In many cases, the parasitic devices in question would not be extracted as true diodes unless they were manually identified by the designer prior to netlist extraction, which is virtually impossible, as these structures may be incorporated into the design inadvertently. As a result, the escape rate for parasitic forward biased diode structures in the physical design is unacceptably high. The costs of such a high escape rate are expensive redesigns, more frequent product failures, and longer times to market.

SUMMARY OF THE INVENTION

In a first aspect of the invention, a method comprises tracing terminals of a junction through a circuit layout to associated power supplies to determine their respective defined bias values, and comparing the bias values to determine whether the junction is forward biased.

In a second aspect of the invention, a method comprises extracting a circuit netlist, tracing terminals of a junction to assigned bias values, and analyzing the assigned bias values for a forward bias condition.

In a third aspect of the invention, a method comprises identifying well biases and assigning wells into groups. The method further comprises identifying nets having one or more connection points in each of at least two of the groups.

In a fourth aspect of the invention, a computer program traces from terminals through a circuit layout to associated power supplies to determine defined bias values for each terminal. The method further comprises comparing the defined bias values in order to determine whether the junction is forward biased.

DETAILED DESCRIPTION OF EMBODIMENTS OF THE INVENTION

The invention provides an intelligent method for locating virtually every parasitic diode device within an integrated circuit design, and analyzing each of these using a set of designer-defined voltage rail values to determine if any parasitic devices within the design would become forward biased. The design may be analyzed under a number of scenarios, including static operation at normal voltage(s), static operation with worst-case voltage skew between signals and/or power domains, and/or power-up transient conditions.

In this way, the problems in the design can be identified while the design is still in the layout stage, before the circuit is physically manufactured. Additionally, because the invention does not require that simulation input patterns be exhaustively defined, a large amount of manual input and review of output can be eliminated, which both saves time and reduces errors.

Figure 1:
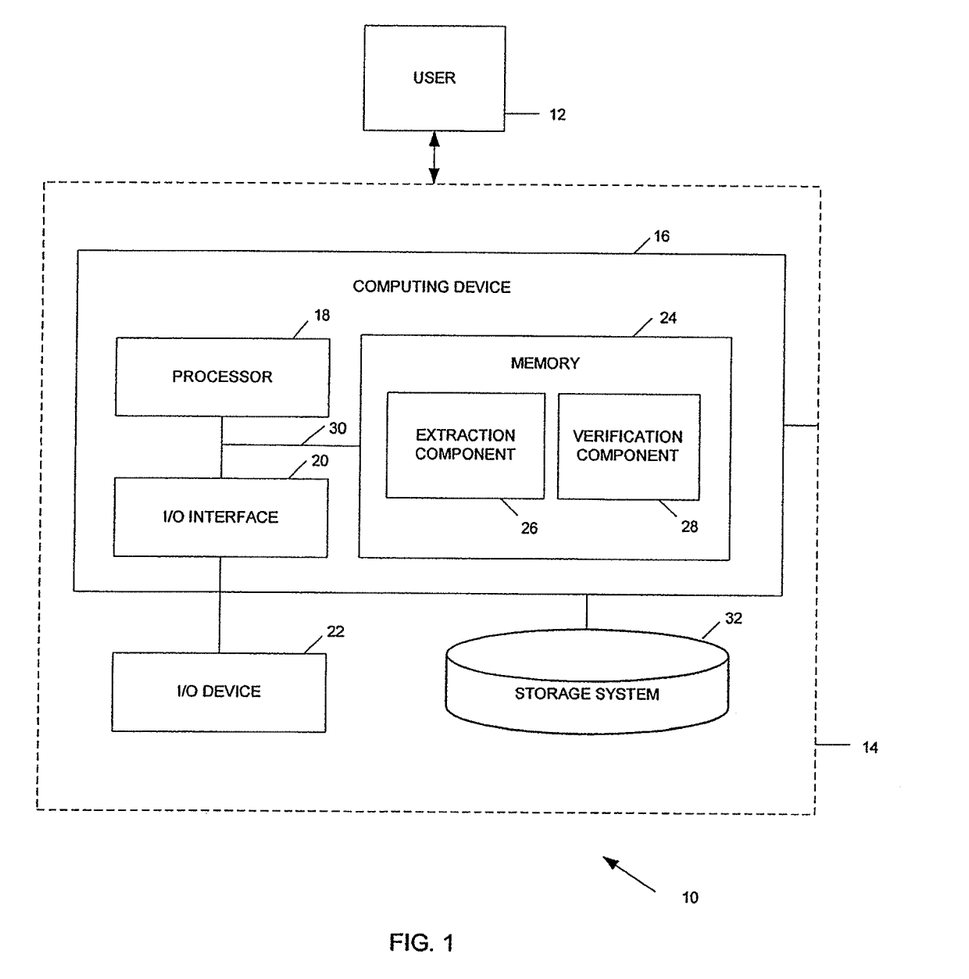
FIG. 1 shows a high level of the components in accordance with the invention.

FIG. 1 shows an illustrative environment 10 for managing the processes in accordance with the invention. To this extent, the environment 10 includes a computer infrastructure 14 that can perform the processes described herein. The computing device 16 is shown including a processor 18, a memory 24, an input/output (I/O) interface 20, and a bus 30. Further, the computing device 16 is shown in communication with an external I/O device/resource 22 and a storage system 32.

As is known in the art, in general, the processor 18 executes computer program code, which is stored in memory 24 and/or storage system 32. The computer program code may be executable code implementing the processes in accordance with the invention. While executing computer program code, the processor 18 can read and/or write data to/from memory 24, storage system 32, and/or I/O interface 20, in accordance with the invention, as described in more detail below. The bus 30 provides a communications link between each of the components in the computing device 16. The I/O device 22 can comprise any device (e.g., a keyboard or telephone keypad) that enables an individual to interact with the computing device 16 or any device that enables the computing device 16 to communicate with one or more other computing devices using any type of communications link.

In any event, the computing device 16 can comprise any general purpose computing article of manufacture capable of executing computer program code installed thereon (e.g., a personal computer, server, handheld device, etc.). However, it is understood that the computing device 16 is only representative of various possible equivalent computing devices that may perform the processes described herein. To this extent, in other embodiments, the functionality provided by computing device 16 can be implemented by a computing article of manufacture that includes any combination of general and/or specific purpose hardware and/or computer program code. In each embodiment, the program code and hardware can be created using standard programming and engineering techniques, respectively.

Similarly, the computer infrastructure 14 is only illustrative of various types of computer infrastructures for implementing the invention. For example, in one embodiment, the computer infrastructure 14 comprises two or more computing devices (e.g., a server cluster) that communicate over any type of communications link, such as a network, a shared memory, or the like, to perform the process described herein. Further, while performing the process described herein, one or more computing devices in the computer infrastructure 14 can communicate with one or more other computing devices external to computer infrastructure 14 using any type of communications link. In either case, the communications link can comprise any combination of various types of wired and/or wireless links; comprise any combination of one or more types of networks (e.g., the Internet, a wide area network, a local area network, a virtual private network, etc.); and/or utilize any combination of various types of transmission techniques and protocols.

The present invention includes both an Extraction Component and a Verification Component to provide early checking for parasitic diode problems using only minimal knowledge of power supply rail voltages. Both the Extraction and Verification Components are independent of a designer-defined simulation pattern set or designer-defined parasitic location. Moreover, both the Extraction and Verification Components may be used individually or in conjunction with each other.

In embodiments of the present invention, a power supply definition table is implemented. This power supply definition table includes the best-case, nominal, and worst-case static values for each power supply in the circuit, and optionally, similar voltage definitions for internal nets within the circuit which may be regulated buses or other local bias points. Using the extracted netlist and the voltage table, each parasitic diode is systematically analyzed by tracing both the anode and cathode of the diode back through functional devices such as transistors, resistors, and diodes to known voltage points. Using these voltage points, it may be determined if a forward bias condition exists for the parasitic diode under a number of different power-on scenarios including nominal operation, maximum best-case and worst-case skew between disparate power rails, and power-up scenarios where one bus (e.g. anode/cathode connection) may be powered down.

The present invention also uses net identification and classification to analyze the physical design for the existence of diffusions on either side of a signal net that crosses a power domain boundary. This is the most common site for introduction of parasitic forward biased diodes and may occur in both twin-well and triple-well CMOS technologies. The method provides early detection of the most common design problems.

Extraction Component

The Extraction Component of the present invention extracts not only typical devices such as transistors, capacitors, and intentional diodes (for electrostatic discharge and reference generation) for physical design netlist extraction, but also includes all parasitic diode devices which result from placement of diffusions within an oppositely doped semiconductor background. Generally speaking, the Extraction Component compiles a list of all the junctions and design data from the physical layout, and looks for conditions that could cause a forward biased diode. A power supply definition table contains the best-case, nominal, and worst-case static values for each power supply required by and contained in the circuit to be analyzed. Optionally, the power supply definition table may contain similar voltage definitions for internal nets within the circuit which may be regulated buses or other local bias points.

Using the extracted netlist and the voltage table, each parasitic diode is systematically analyzed, tracing both the anode and cathode of the diode back through functional devices such as transistors, resistors, and diodes to known voltage points. Using these voltage points, it may be determined if a forward bias condition exists for the parasitic diode under a number of different power-on scenarios including nominal operation, maximum best-case and worst-case skew between disparate power rails, and power-up scenarios where one bus (e.g. anode/cathode connection) may be powered down.

The Extraction Component comprises two elements, a power supply voltage table and an analysis tool. The power supply voltage table defines the minimum, nominal, and maximum voltage value for each power supply, e.g. GND, $V_{dd}$, within the prime cell. Additionally, the voltage table may be coded to define the voltage range of nets internal to the circuit being verified. This feature is useful in defining the voltage range of internally-regulated power supply buses or other local biasing structures.

The following is an example of a power supply table:

|  | LOW | NOM | HIGH |
|---|---|---|---|
| GND | −0.20 | 0.00 | 0.20 |
| AGND | −0.20 | 0.00 | 0.20 |
| $V_{dd}$ | 0.80 | 1.05 | 1.30 |
| $AV_{dd}$ | 2.25 | 2.50 | 2.75 |
| $V_{cc}$ | 1.10 | 1.20 | 1.30 internal |
| NW | $V_{dd}$ | | |
| PW | GND | | |

The power supply table shown above defines power pins (and nets) GND and AGND of the prime cell to operate between −0.20 and 0.20 volts. Similarly, bus $V_{dd}$ is defined to operate between 0.8 and 1.3 volts, and bus $AV_{dd}$ is defined to operate between 2.25 and 2.75 volts. A power bus, $V_{cc}$, which is not a power pin of the prime cell, but rather an internal bus, is defined to operate between 1.1 and 1.3 volts. Two additional buses, NW (an nWell) and PW (a pWell) are linked to the power supply ranges of $V_{DD}$ and GND respectively.

In embodiments, the analysis tool creates a netlist (including parasitic diodes) from a physical layout, and relates each node of any PN junction within the netlist to a known power supply bus as defined in the power supply voltage table. With voltage relations for each node identified, the PN junction is analyzed to determine if a forward bias condition exists. Structures in reverse bias are discarded, while those meeting the forward bias criteria defined within the tool are reported as errors.

Figure 2:
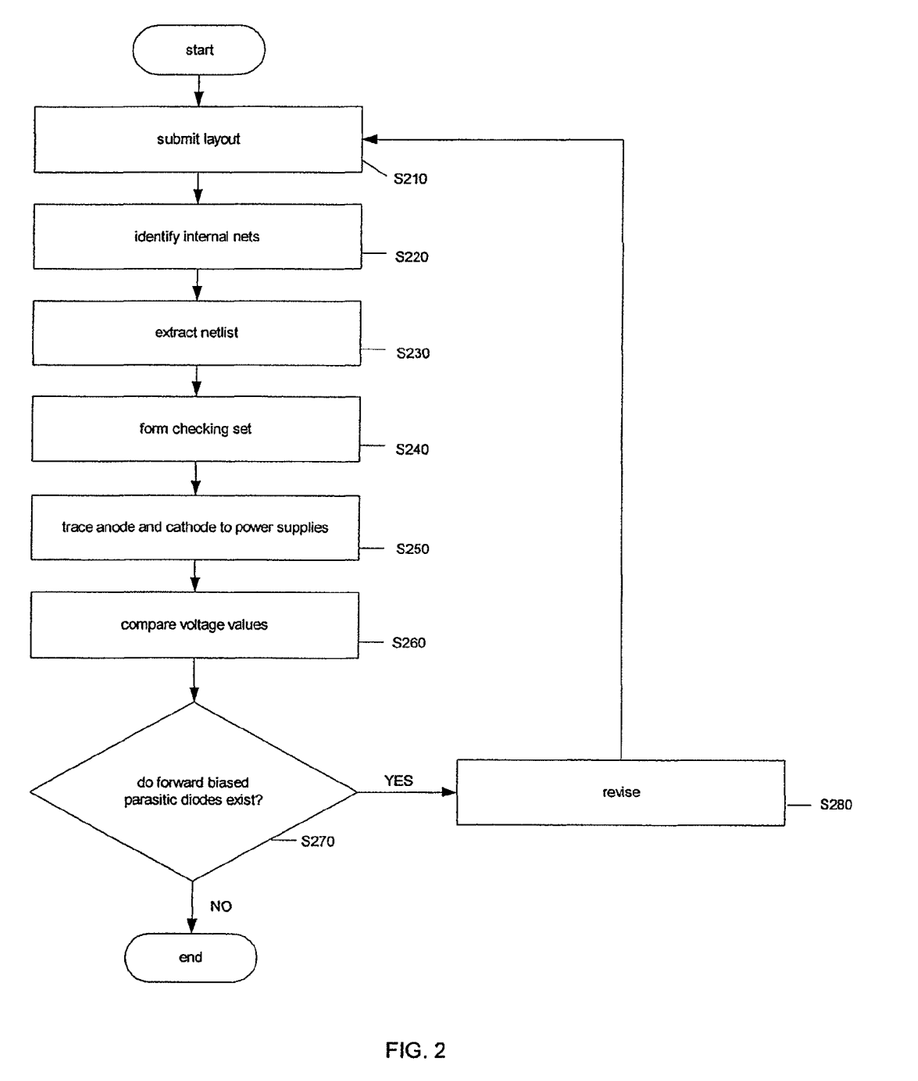
FIG. 2 is a flow chart showing the process steps of the Extraction Component according to one embodiment of the invention.

FIG. 2 is a flow diagram implementing steps of the invention. FIG. 2 (and all other flow diagrams) may equally represent a high-level block diagram of the invention. The steps of the flow diagrams may be implemented and executed from either a server, in a client server relationship, or they may run on a user workstation with operative information conveyed to the user workstation to create the navigation outlined above. Additionally, the invention can take the form of an entirely hardware embodiment, an entirely software embodiment or an embodiment containing both hardware and software elements.

In an embodiment, the invention is implemented in software, which includes but is not limited to firmware, resident software, microcode, etc. Furthermore, the invention can take the form of a computer program product accessible from a computer-usable or computer-readable medium providing program code for use by or in connection with a computer or any instruction execution system. For the purposes of this description, a computer-usable or computer readable medium can be any apparatus that can contain, store, communicate, propagate, or transport the program for use by or in connection with the instruction execution system, apparatus, or device. The medium can be an electronic, magnetic, optical, electromagnetic, infrared, or semiconductor system (or apparatus or device) or a propagation medium.

Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W), and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution. Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

First, in S210, the layout of the IC design and the power supply voltage table are submitted to the Extraction Component. Next, in S220, the voltage table is audited for internal nets with defined voltage values. To this end, internal nets listed in the table are searched for in the physical design. Although the present invention is described in terms of a non-hierarchical (flat) environment, it would be obvious to one of skill in the art that the present invention applies to both hierarchical and flat environments. Matches found in the hierarchy are kept, and the attribute is propagated up and down through the hierarchy. In a similar manner, nets of the prime cell, including those power supply nets listed in the table, are kept and their attributes are propagated down through the hierarchy.

Then, in S230, the physical design is extracted to a netlist containing the functional components of the design, e.g. FETs, resistors, capacitors, bipolar devices, and diodes, along with any parasitic PN junctions that result from the formation of elements such as nWell and pWell tubs, floating gate protect devices, source/drain diffusions or the like, which normally do not appear within the schematic view of the circuit. Next, in S240, a checking set is formed. PN junctions within the netlist are grouped into a set of PN junctions requiring checking for forward bias conditions. In embodiments of the invention, all PN junctions are grouped, whereas in other embodiments, any PN junction in the set which is designated as a known diode shape through use of an electrostatic discharge or other diode marking shape and appears within the schematic view of the circuit such that the schematic and layout views equate, is removed from the set of diodes to be checked. This removes structures such as electrostatic discharge diodes and functional forward-biased diodes for bandgap and reference structures that would otherwise show up as forward-bias errors in at least one of several analysis passes.

Then, in S250, using the extracted netlist, a path is traced from each terminal (e.g., anode and cathode) of the PN junction back to a power supply defined within the voltage table. In this process, in embodiments, the trace algorithm shorts devices, such as FETs and resistors, in the path to the supply bus. If, during a trace from the anode, a branch is found, the leg with the higher voltage potential is chosen. Conversely, if, during a trace from the cathode, a branch is found, the leg with the lower voltage potential is chosen. On reaching a supply defined in the voltage table, the terminal of the diode is assigned the power supply attribute with its corresponding voltage table minimum, nominal, and maximum voltages. If a trace back to a supply in the table cannot be found, the terminal is assigned an "undefined region" supply attribute with the default minimum, nominal, and maximum voltage values assigned within the trace program.

Then, in S260, the voltage values are compared. As discussed above, in S250, the anode and cathode were traced to the minimum, nominal, and maximum voltages. In various embodiments, these values may be compared in a Nominal Supply Analysis, a Skewed Supply Analysis, a Power-Up Supply Analysis, or any combination of these comparisons.

In a Nominal Supply Analysis, the nominal voltage value for the power supply traced from the PN junction's anode is assigned to the anode. The nominal voltage value for the power supply traced from the PN junction's cathode is assigned to the cathode. The bias of the PN junction is calculated subtracting the cathode voltage from the anode voltage.

In a Skewed Supply Analysis, the maximum voltage value for the power supply traced from the PN junction's anode is assigned to the anode. The minimum voltage value for the power supply traced from the PN junction's cathode is assigned to the cathode. The bias of the PN junction is calculated subtracting the cathode voltage from the anode voltage.

In a Power-Up Supply Analysis, the maximum voltage value for the power supply traced from the PN junction's anode is assigned to the anode. The cathode is assumed to be unpowered, simulating worst-case power-supply power up/down separation for the circuit and a Ground value for the cathode is assigned. The bias of the PN junction is calculated subtracting the cathode voltage from the anode voltage.

Next, in S270, it is determined whether forward biased diodes exist. By way of illustration, if the resulting PN bias is positive and greater than a forward bias pre-determined threshold set within the algorithm, for example 0.4 volts, and modifiable by the engineer executing the check, the PN junction is determined to be forward biased. If so, a results table is generated, which lists possible forward biased diodes. This analysis identifies supply-to-supply coupling resulting from the order of powering up or from partial power-down scenarios.

In more complicated circuit layouts, as shown in S280, the process may be repeated, revising the circuit layout and further testing each revised circuit layout until it is determined that no forward biased diodes exist in the design. In one embodiment of the invention, the Extraction Component may be repeated iteratively as necessary to identify any forward biased parasitic diodes, revise the layout to remove the identified structures, and then run the Extraction Component again until no forward biased parasitic diodes remain. In another embodiment of the invention, the Extraction Component and the Verification Component (discussed below) are both run, either alternatively or each as necessary, with successive iterations until no forward biased parasitic diodes remain.

Figure 3:
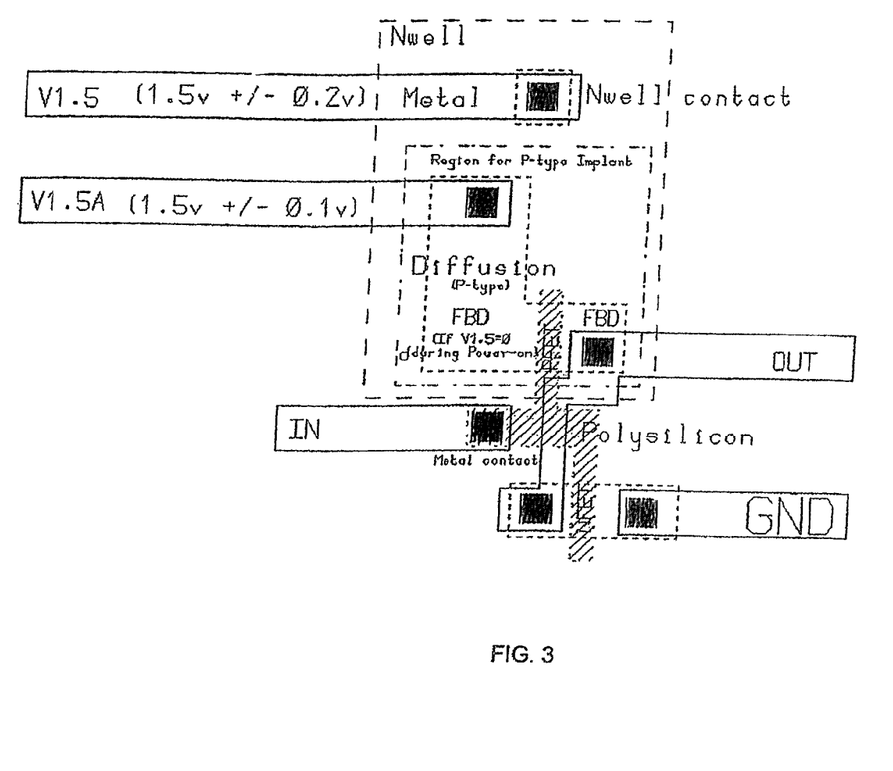
FIG. 3 is representative of a circuit layout including a parasitic diode.

As an example, an illustrative circuit layout shown in FIG. 3 was analyzed, and the following results table was generated in accordance with the invention:

Possible Forward biased diode: psd.nw V1.5A V1.5 x=−2.65 y=3.00
V1.5A voltage range: (1.40 to 1.60) V1.5 voltage range: (1.30 to 1.70)
1.60 volts (V1.5A)>0 volts during powerup, if V1.5 power supply is powered after V1.5A
pn-junction might become forward biased (Forward bias condition threshold=0.4 volts)

Possible Forward biased diode: psd.nw OUT V1.5 x=−2.04 y=2.48
OUT voltage range: (0.00 to 1.60) V1.5 voltage range: (1.30 to 1.70)
1.60 volts (OUT)>0 volts during powerup, if V1.5 power supply is powered later.
NOTE: Max anode voltage possible by tracing this anode through the circuit to power supplies.
pn-junction might become forward biased (Forward bias condition threshold=0.4 volts)

The analysis identified two forward biased diodes during a powerup sequence if the power supply V1.5 was powered after the V1.5A supply was powered. These supplies were listed separately in a power supply definition table, indicating they are independent and could be powered up at different times. Both diode junctions are p-diffusions inside nwells (psd.nw). The first junction has its anode connected to supply V1.5A and its cathode connected to supply V1.5, with the junction x,y locations listed from the layout. The voltage ranges for the anode and cathode are also listed from the power supply definition table. The specific analysis condition which would cause the forward biased diode is also given: 1.60 volts (V1.5A)>0 volts during powerup. An explanatory comment is included: "if V1.5 power supply is powered after V1.5A."

The second identified diode is similar. One difference is that the anode is OUT which is not a power supply, but can be traced through the circuit back to power supply V1.5A. The OUT voltage range is then 0.00 volts when it is not powered up through the circuit, and a maximum of 1.60 volts which is the maximum for supply V1.5A from the power supply definition table. Again, if supply V1.5A is powered before supply V1.5, the second diode can become forward biased.

Figure 4:
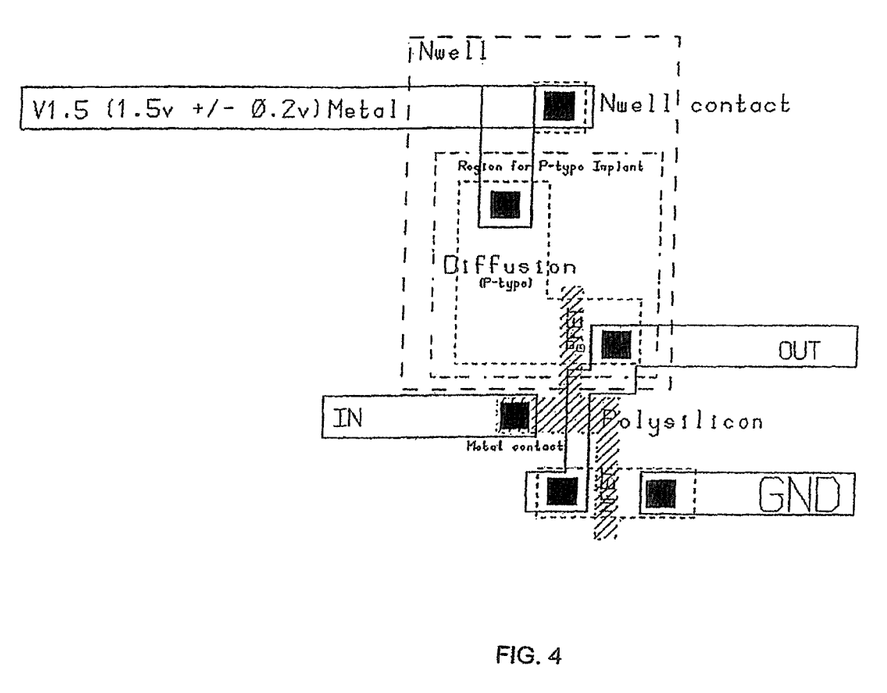
FIG. 4 is representative of circuit layout shown in FIG. 3 after having been revised to remove the parasitic diode identified in accordance with the present invention.

In accordance with the above analysis, the design was then revised in order to remove the identified parasitic diode(s). The revised illustrative circuit layout is shown in FIG. 4, with the parasitic diode(s) identified by the present invention having been removed. The circuit layout shown in FIG. 4 was analyzed, and the following results table was generated in accordance with the invention:

Empty—No forward biased diodes.

This table shows that the forward biased parasitic diode that had been identified during analysis of the circuit layout shown in FIG. 3 has been removed.

In embodiments of the Extraction Component, valid and invalid power supply relationships for the skewed and power-on tests are defined within the power supply voltage table or other file. In this way, unnecessary testing of invalid combinations of power supplies may be avoided. For example, if $AV_{dd}$ is defined as an IC-level supply and $V_{cc}$ as an internal supply, PN junctions between $AV_{dd}$ and $V_{cc}$ would be tested. If a PN junction existed between $V_{cc}$ and $AV_{dd}$, it would be reported as an error when the power-on test is performed with $V_{cc}$ powered-up and $AV_{dd}$ powered-down. If $V_{cc}$ happened to be a regulated internal power supply sourced from $AV_{dd}$, it would be impossible for $V_{cc}$ to be powered-up with $AV_{dd}$ powered-down and the test condition would be invalid. Therefore, if such valid and invalid power supply relationships are included in the voltage table or another table, for example to indicate for each supply whether a dependency to another supply existed, which supply the given supply was dependent upon, or whether the dependency was a known skew/tracking relation or a known power-up relation, then the number of invalid tests run and the overall run time could both be reduced.

Verification Component

The Verification Component of the present invention uses net identification and classification to analyze an integrated circuit physical design for the existence of diffusions on either side of a signal net that crosses a power domain boundary. This is the most common site for introduction of parasitic forward biased diodes and may occur in both twin-well and triple-well CMOS technologies. In this way, the Verification Component can identify forward biased parasitic diodes without time consuming manual input, and with reduced potential for error in the otherwise manual review of output.

The Verification Component checks for the most common parasitic diode topology within today's CMOS circuits early in the physical design process. The method works to identify and group different power domains and verify that nets that communicate between the identified power domains do not contain structures that could forward bias. Unlike the Extraction Component, the Verification Component does not require a voltage table, however, it does require well attributes.

Figure 5:
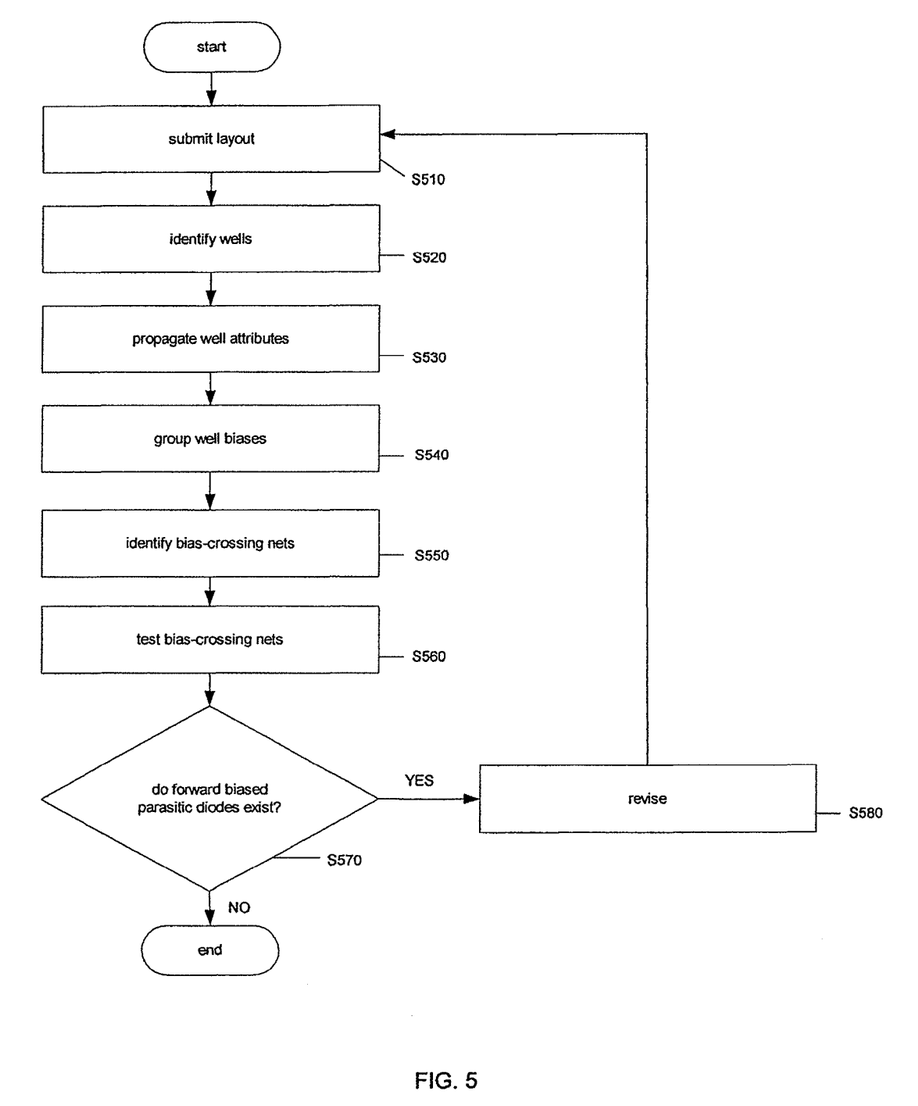
FIG. 5 is a flow chart showing the process steps of the Verification Component according to one embodiment of the invention.

FIG. 5 is a flow diagram implementing steps of the invention. First, in S510, the layout of the IC design and the well biases expected to be encountered in the design, e.g. nWell biases, $V_{dd}$ and $AV_{dd}$, pWell biases, GND, and AGND, are submitted to the Verification Component.

Then, in S520, the wells are identified by attributes. The physical design is searched for well labels that indicate well bias, where the label is used to assign a "bias" to the well structure. At least one well label for each bias should exist in the design to optimize checking coverage.

Next, in S530, well attributes are propagated. That is, the connectivity of the wells is traced within the design. Unlabeled wells found within the design will be assigned the bias of a labeled well with which they share bias connection. If a well is not labeled and not traceable to one that is labeled, a unique label is assigned.

Then, in S540, the well biases are grouped. That is, wells having the same bias are placed into groups together. For example, nWells at $V_{dd}$ would be placed in a first group. Similarly, nWells at $AV_{dd}$ would be placed in a second group. Grouping of pWells and nWells is done separately.

Next, in S550, bias-crossing nets are identified. That is, all nets are identified that connect at least one circuit, a portion of which is formed within a well group of a first bias, to at least one other circuit, a portion of which is formed within a well group of a second bias. By this process, every net that crosses a power domain is found. In one embodiment, nets crossing nWell biases are searched for, so any net with a sink or source in an nWell biased to $V_{dd}$ and a sink or source in an nWell biased to $AV_{dd}$ is identified.

Then, in S560, the above-identified bias crossing nets are tested to determine whether forward-biased structures exist. For example, p+ diffusions in nWells on either side of the boundary are checked, regardless of whether the p+ diffusion is the source or drain of a FET or a floating gate protect structure. While the intent of the check is to find p+ diffusions such as floating gate contacts in the sink nWell that would couple the two nWells if the net were driven high and a potential difference existed between the two biases, this also enforces NFET level shifter requirements for power boundaries as well in the present technology. Any p+ diffusion on the net being checked will be flagged as an error. In parallel, this process may be used to check for n-type diffusions in pWells. In one embodiment of the invention, filtering shapes such as "DIODE" may be used within the physical design to exempt specific diffusions or regions of the physical design from the test. Next, in S570, if forward biased diodes exist, a results table is generated, which lists possible forward biased diodes.

In more complicated circuit layouts, as shown in S580, the process may be repeated, revising the circuit layout and further testing each revised circuit layout until it is determined that no forward biased diodes exist in the design. In one embodiment of the invention, the Verification Component may be repeated iteratively as necessary to identify any forward biased parasitic diodes, revise the layout to remove the identified devices, and then run the Verification Component again until no forward biased parasitic diodes remain. As discussed above, in another embodiment of the invention, the Extraction Component and the Verification Component are both run, either alternatively or each as necessary, with successive iterations of each or both until no forward biased parasitic diodes remain.

While the invention has been described in terms of exemplary embodiments, those skilled in the art will recognize that the invention can be practiced with modifications and in the spirit and scope of the appended claims. Furthermore, while the invention has been described in terms of steps, it is not necessary that the steps be performed in the order described.

What is claimed is:

1. A method of forward biased diode identification within an integrated circuit physical design, comprising:
    identifying, by a computer device, well biases within an integrated circuit physical design;
    assigning, by the computer device, wells into groups based upon well bias identification, wherein the assigning comprises placing nWells at $V_{dd}$ in a first group and nWells at $AV_{dd}$ in a second group;
    identifying, by the computer device, integrated circuit nets which have one or more connection points in each of at least two of the groups; and
    checking, by the computer device, the identified integrated circuit nets for potential forward biased structures.

2. The method of claim 1, wherein the method locates parasitic diode devices within the integrated circuit physical design.

3. The method of claim 2, wherein each parasitic diode is systematically analyzed.

4. The method of claim 1, wherein the method utilizes one of a power supply definition table and a voltage table.

5. The method of claim 1, wherein the method further comprises testing each identified net having one or more connection points in each of at least two of the groups to determine whether the identified net includes a diffusion in an oppositely doped well.

6. The method of claim 1, wherein the identification of well biases comprises a label that indicates the bias of the associated well structure.

7. The method of claim 1, further comprising generating a results table listing the potential forward biased structures.

8. The method of claim 1, wherein the wells are identified by attributes.

9. The method of claim 8, wherein the integrated circuit physical design is searched for well labels that indicate well bias, where the label is used to assign a bias to a well structure.

10. The method of claim 9, wherein at least one well label for each well bias exists to optimize checking coverage.

11. The method of claim 9, further comprising propagating the well attributes within the integrated circuit physical design.

12. The method of claim 11, wherein connectivity of the wells is traced within the integrated circuit physical design.

13. A method of forward biased diode identification within an integrated circuit physical design, comprising:
    identifying, by a computer device, well biases within an integrated circuit physical design;
    assigning, by the computer device, wells into groups based upon well bias identification;
    identifying, by the computer device, integrated circuit nets which have one or more connection points in each of at least two of the groups; and
    checking, by the computer device, the identified integrated circuit nets for potential forward biased structures,
    wherein the wells are identified by attributes;

the integrated circuit physical design is searched for well labels that indicate well bias, where the label is used to assign a bias to a well structure;

further comprising propagating the well attributes within the integrated circuit physical design, wherein connectivity of the wells is traced within the integrated circuit physical design; and unlabeled wells found within the integrated circuit physical design are assigned a bias of a labeled well with which they share bias connection.

14. The method of claim 13, further comprising assigning a unique label when a well is not labeled and not traceable to one that is labeled.

15. The method of claim 14, wherein wells having the same bias are placed into groups together.

16. The method of claim 15, further comprising identifying bit cross nets after the grouping, such that all nets are identified that connect at least one circuit, a portion of which is formed within a well group of a first bias, to at least one other circuit, a portion of which is formed within a well group of a second bias.

17. The method of claim 16, wherein the identified crossing nets are tested to determine whether forward-biased structures exist.

18. The method of claim 1, wherein the identifying integrated circuit nets which have one or more connection points in each of at least two of the groups comprises identifying all integrated circuit nets which have one or more connection points in each of at least two of the groups.

19. A method of forward biased diode identification within an integrated circuit physical design, comprising:

identifying, by a computer device, well biases within an integrated circuit physical design;

assigning, by the computer device, wells into groups based upon well bias identification;

identifying, by the computer device, integrated circuit nets which have one or more connection points in each of at least two of the groups; and checking, by the computer device, the identified integrated circuit nets for potential forward biased structures, wherein the integrated circuit physical design is searched for well labels that indicate well bias, where the label is used to assign a bias to a well structure; and unlabeled wells found within the integrated circuit physical design are assigned a bias of a labeled well with which they share bias connection.

* * * * *